United States Patent
Robinson et al.

(10) Patent No.: US 8,242,665 B2
(45) Date of Patent: Aug. 14, 2012

(54) FLIP-CHIP INTERCONNECTION THROUGH CHIP VIAS

(75) Inventors: Andrew L. Robinson, Bellevue, WA (US); Richard E. Davidsen, Andover, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 223 days.

(21) Appl. No.: 12/442,572

(22) PCT Filed: Sep. 18, 2007

(86) PCT No.: PCT/IB2007/053771
§ 371 (c)(1),
(2), (4) Date: Mar. 24, 2009

(87) PCT Pub. No.: WO2008/038183
PCT Pub. Date: Apr. 3, 2008

(65) Prior Publication Data
US 2010/0025785 A1    Feb. 4, 2010

Related U.S. Application Data

(60) Provisional application No. 60/826,815, filed on Sep. 25, 2006.

(51) Int. Cl.
*H01L 41/047* (2006.01)
(52) U.S. Cl. .................................. 310/334; 310/365
(58) Field of Classification Search .............. 310/322, 310/334, 335, 365, 366, 311
See application file for complete search history.

(56) References Cited

U.S. PATENT DOCUMENTS

| 5,744,898 | A |   | 4/1998 | Smith |
| 5,852,860 | A |   | 12/1998 | Lorraine |
| 6,015,652 | A |   | 1/2000 | Ahlquist |
| 6,491,634 | B1 |   | 12/2002 | Leavitt |
| 7,449,821 | B2 | * | 11/2008 | Dausch .......................... 310/364 |
| 2003/0028106 | A1 |   | 2/2003 | Miller |
| 2003/0205947 | A1 |   | 11/2003 | Klee |
| 2004/0048470 | A1 |   | 3/2004 | Dinet |
| 2004/0100163 | A1 | * | 5/2004 | Baumgartner et al. ....... 310/334 |
| 2006/0118939 | A1 |   | 6/2006 | Fisher |
| 2007/0276238 | A1 | * | 11/2007 | Sudol ........................... 600/437 |

(Continued)

FOREIGN PATENT DOCUMENTS

EP    1675171 A2    6/2006

(Continued)

OTHER PUBLICATIONS

Cheng, C.H. et al "An Efficient Electrical Addressing Method using Through-Water Vias for Two-Dimensional Ultrasonic Arrays" Ultrasonics Symposium, Oct. 2000, pp. 1179-1182.

(Continued)

*Primary Examiner* — Derek Rosenau
(74) *Attorney, Agent, or Firm* — W. Brinton Yorks, Jr.

(57) ABSTRACT

An acoustic assembly that includes an integrated circuit package having an electrically conductive via configured to pass from an active portion of the integrated circuit package through a bottom portion of the integrated circuit package. The bottom portion is a bottom side of a substrate of the integrated circuit package. An acoustic element is positioned on the bottom side of the substrate and the via is arranged to electrically couple the active portion of the integrated circuit package to the acoustic element. In one embodiment, the acoustic element is an acoustic stack and the integrated circuit package is an ASIC. The assembly microbeamformed transducer.

14 Claims, 3 Drawing Sheets

U.S. PATENT DOCUMENTS

2008/0315724 A1* 12/2008 Kunkel, III ................... 310/334

FOREIGN PATENT DOCUMENTS

| GB | 2368123 A1 | 4/2002 |
| WO | 0030543 A1 | 6/2000 |
| WO | 2004052209 A1 | 6/2004 |
| WO | 2006018805 A1 | 2/2006 |
| WO | WO 2006/075283 * | 7/2006 |

OTHER PUBLICATIONS

Calmes S. et al "Highly Integrated 2-D Capacitive Micromachines Ultrasonic Transducers" Ultrasonics Symposium, Oct. 1999 pp. 1163-1166.

* cited by examiner

FLIP-CHIP INTERCONNECTION THROUGH CHIP VIAS

The present system relates to an interconnection method and device that uses a flip-chip type of electrical interconnection and through chip vias.

Current state of the art integrated circuits (ICs) are continuously shrinking in size and increasing in complexity. As density of components increases, the system of electrically coupling components has become critical in that the physical interconnections occupy a signification portion of available surface area reducing the ability to position electrical circuitry within this area.

An electrical interconnection technology is known wherein one portion of the interconnection is formed by a contact bump or stub and another portion of the interconnection is formed by a contact pad or surface. During the manufacturing process, the bump and pad are brought into contact with each other to form the electrical interconnection. U.S. Pat. No. 6,015,652 incorporated herein by reference as if set out in entirety discloses a type of such an interconnection system termed "flip-chip bonding" for ICs mounted on a substrate. This typical interconnection system alleviates some of the problems associated with other electrical interconnection systems, yet still occupies much of available surface area that might otherwise be utilized for electronic components. This problem is exacerbated further when the electrical interconnection is made directly to an integrated circuit, such as an Application-Specific Integrated Circuit (ASIC).

PCT Patent Application WO 2004/052209 incorporated herein by reference as if set out in entirety, discloses a system of electrically coupling an ASIC to a plurality of acoustic elements for the purposes of forming a miniaturized transducer array. In the shown system, the bump is electrically coupled to one of the acoustic element or ASIC and the pad is electrically coupled to the other of the acoustic element or ASIC. This system realizes a small electrical package that for example, may be formed to create an ultrasonic transducer that may be utilized for transesophageal, laparoscopic and intra-cardiac examination.

Microbeamformed (uBF) transducers currently being designed commonly make use of the flip-chip process to achieve integration of the acoustic element, such as an acoustic sensor, with a microbeamformer ASIC. This process is highly successful in addressing the difficult problem of interconnecting thousands of elements to the uBF ASICs. However, the resulting devices have several issues. For example, the flip-chip process puts the ASIC immediately behind the acoustic element, as close to the face of the acoustic element as provided by the type of bonding performed (e.g., stub bumps). Yet, heat from the ASIC may affect the performance of the acoustic elements. Accordingly, the typical flip-chip interconnection from the perspective of managing face temperature of the acoustic element, places the acoustic element in almost the worst possible location, namely close to the heat source (e.g., the ASIC) and remote from potential heat dissipation surfaces.

In addition, the close coupling of the acoustic element to active portions of the ASIC may have an adverse effect of creating haze artifacts caused by coupling of acoustic energy into the ASIC, where it may propagate and result in acoustic crosstalk. The flip-chip process between the ASIC and the acoustic element is also complex since the ASIC cannot be bonded directly to the acoustic element. A physical offset is required between the ASIC and acoustic element to allow for dicing tolerances introduced by variations in a thickness of the acoustic element and variations in a diameter of the dicing saw blade from a beginning to an end of the dicing process. This spacing is typically introduced utilizing high aspect ratio stud bumps or plated bumps which complicates the assembly process.

System input/output (I/O) interconnections of current uBF ASICs are limited to having system I/O on two azimuthal edges on a top active portion of the ASIC. This requires an allocation of some space to provide for interconnections from bond pads on the top surface of the ASIC to a next level of interconnect, such as a flex circuit. Wire bonds or a bonded flex cable using an anisotropic conductive film may be utilized for interconnection purposes, however, in either case the physical space limitations of a complete transducer (e.g., ASIC, acoustic sensor, flex cable) reduce an amount of contact area available for the acoustic aperture of the transducer. In addition, flex circuits are typically relatively simple with few layers of interconnect due to space considerations, which can limit electrical performance and/or increase cost.

It is an object of the present system to overcome disadvantages and/or make improvements in the prior art.

The present system includes an acoustic assembly and a method of forming the assembly. The acoustic assembly includes an integrated circuit package having an electrically conductive via configured to pass from an active portion of the integrated circuit package through a bottom portion of the integrated circuit package. The bottom portion is a bottom side of a substrate of the integrated circuit package. An acoustic element is positioned on the bottom side of the substrate and the via is arranged to electrically couple the active portion of the integrated circuit package to the acoustic element. In one embodiment, the acoustic element is an acoustic stack. In another embodiment the acoustic element is a silicon based Micromachined Ultrasound Transducer (MUT).

In forming the acoustic assembly, the acoustic assembly is diced through the acoustic stack and into the substrate. The acoustic element may be coupled to the via by an inverted flip-chip interconnection, a conductive adhesive, and/or other suitable coupling systems without regard to the coupling distance between the acoustic element and the integrated circuit package. Advantageously, an interconnection device may be positioned on a top side of the integrated circuit package in proximity to the active portion and electrically coupled to system input/output (I/O) connections of the integrated circuit package. The interconnection device may be coupled to the system I/O connections by a flip-chip interconnection and/or other suitable coupling systems without requiring wire bonds and other systems for extending the system I/O to edges of the integrated circuit package. In one embodiment, the interconnection device may be a flex circuit including a printed circuit board (PCB). The integrated circuit package may be a microbeamformer ASIC for use in a transducer, such as an ultrasonic transducer that may be utilized for transesophageal, laparoscopic and/or intra-cardiac examination.

The invention is explained in further detail, and by way of example, with reference to the accompanying drawings wherein.

The following are descriptions of illustrative embodiments that when taken in conjunction with the drawings will demonstrate the above noted features and advantages, as well as further ones. In the following description, for purposes of explanation rather than limitation, specific details are set forth such as architecture, interfaces, techniques, etc., for illustration. However, it will be apparent to those of ordinary skill in the art that other embodiments that depart from these details would still be understood to be within the scope of the appended claims. Moreover, for the purpose of clarity, detailed descriptions of well-known devices, circuits, and methods are omitted so as not to obscure the description of the present system. In addition, it should be expressly understood that the drawings are included for illustrative purposes and do not represent the scope of the present system. In the accompanying drawings and description, like reference numbers are utilized to designate similar elements.

Figure 1:
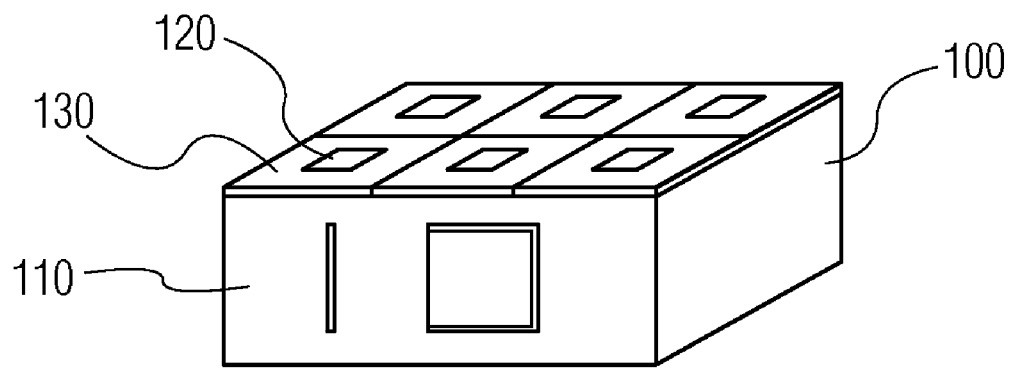
FIG. 1 shows an illustrative perspective side view of a portion of a wafer-scale integrated circuit prepared in accordance with an embodiment of the present system.

FIG. 1 shows an illustrative perspective side view of a portion of a wafer-scale integrated circuit, such as an ASIC 100, prepared in accordance with an embodiment of the present system. The ASIC 100 is formed on a silicon substrate 110 and includes a micro-channel active volume which represents an active portion 130 of the ASIC 100 wherein processing of acoustic signals from an acoustic element occurs. Typically the micro-channel active volume may be formed as a square area having sides in the range of 100-400 um, such as 250 um, and may be formed having a depth in the range of 5-20 um, such as 10 um. The ASIC 100 further includes a bond pad area 120 typically utilized for interconnecting portions of the active portion of the ASIC 100 to an acoustic element. The ASIC 100 may be formed from typically processes acts such as photolithographic processes including photo deposition of desired layers, etching, masking, and the like.

During wafer scale processing of the ASIC 100, through ASIC vias may be formed in the bond pad area 120. The through ASIC vias provide a conductive path from a sensor input/input (I/O) located in the active portion 130 of the ASIC through a bottom surface of the ASIC thereby, passing through the substrate 110. The vias and conductive paths may be formed utilizing suitable photolithographic and plating processes such as etching and electroplating.

Figure 2:
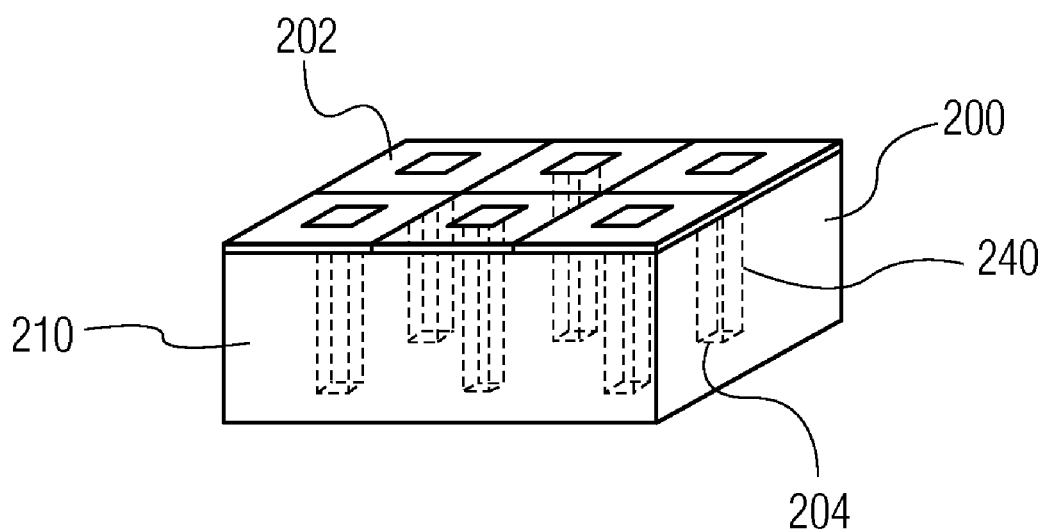
FIG. 2 shows an illustrative perspective view of an ASIC in accordance with an embodiment of the present system.

FIG. 2 shows an illustrative perspective view of an ASIC 200 in accordance with an embodiment of the present system. As shown, the ASIC 200 includes through ASIC vias 240 that provide a conductive path from I/O of an active portion 202 of the ASIC 200, through a substrate 210 to a bottom surface 204 of the ASIC 200. In this way in accordance with the present system, I/O of the ASIC that typically is coupled to acoustic elements, such as an acoustic stack, is routed through to the bottom portion 204 of the ASIC 200. After the formation of the through vias 240, the ASIC 200 may be singulated by separating the ASIC 200 from the wafer to prepare the ASIC 200 for electrical coupling to the acoustic element.

Figure 3:
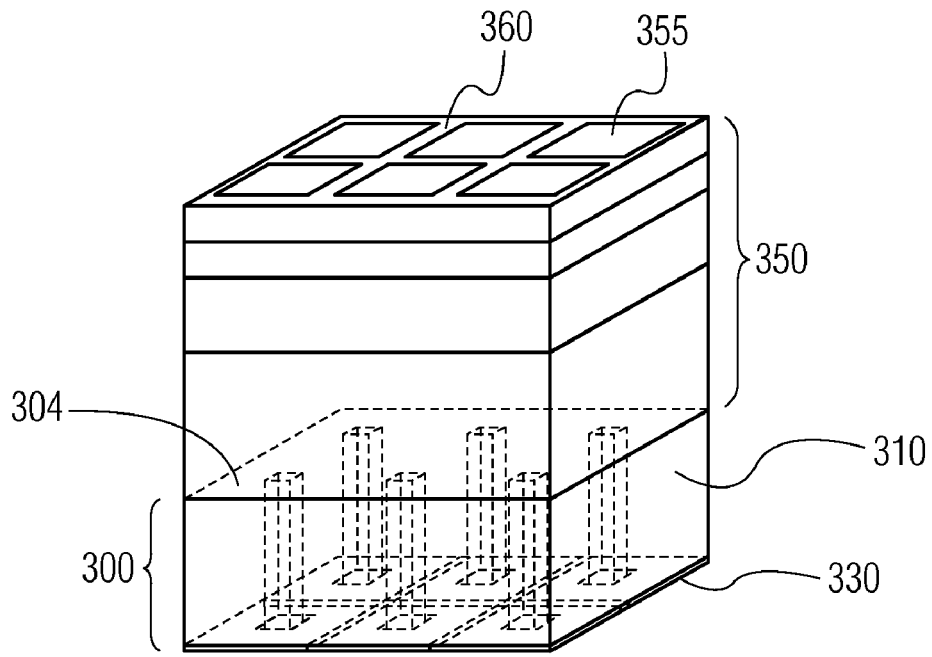
FIG. 3 shows an illustrative element, such as a plate or stack of acoustic elements coupled to an electrical component in accordance with an embodiment of the present system.

FIG. 3 shows an illustrative element, such as a plate or stack 350 of acoustic elements 355 coupled to an electrical component, such as an ASIC 300. In accordance with the present system, since the acoustic elements 355 are coupled to the ASIC 300 along a bottom portion 304 of the ASIC 300 away from an active portion 330, the acoustic elements 355 may be electrically coupled to the ASIC utilizing any suitable coupling process without regard to a height aspect of the coupling. For example, a conductive adhesive may be utilized or lead bumps without regard to the height of the interconnection itself. In one embodiment, the acoustic element may, in effect, be inverted flip-chip bonded to the ASIC. By the term "inverted flip-chip bonding" what is intended is that the present system results in bonding of the acoustic element to a bottom side of the as opposed to prior flip-chip bonding techniques wherein the acoustic element is bonded to a top (active) side of the ASIC in immediate proximity to the ASIC I/O. Unlike prior systems, there is no need for a relatively large coupling height to accommodate required tolerances in the dicing process since the active portion 330 of the ASIC is separated from the acoustic elements 355 by a substrate 310 of the ASIC 300. Accordingly, other systems for electrically coupling the acoustic elements 355 to the ASIC 300 may also be suitably utilized without regard to the coupling height.

It should be noted that the active portion 330 of the ASIC 300 is typically where heat is generated. In accordance with the present system, the active portion 330 is located further away from the acoustic elements 355 and a face of a transducer formed from the acoustic elements 355, ASIC 300, etc. In this way, unlike prior systems, the problems of managing the transducer face temperature are greatly simplified. In addition, the active portion 330 may also be positioned in closer proximity to a heat sink than previously possible. In this way in accordance with the present system, the thermal resistance to the acoustic elements is increased while the thermal resistance to the heat sink is decreased.

After electrical coupling of the acoustic elements 355 to the ASIC 300, an underfill may be applied to stabilize the plate with regard to the ASIC 300. The underfill helps to protect the electrical coupling between the acoustic elements 355 and the ASIC 300 from environmental conditions, provides additional mechanical strength to the assembly, acts as a heat sink to help dissipate heat away from the acoustic elements 355, and may help compensate for any thermal expansion differences between the acoustic components 355 of the stack and the ASIC 300.

Figure 4:
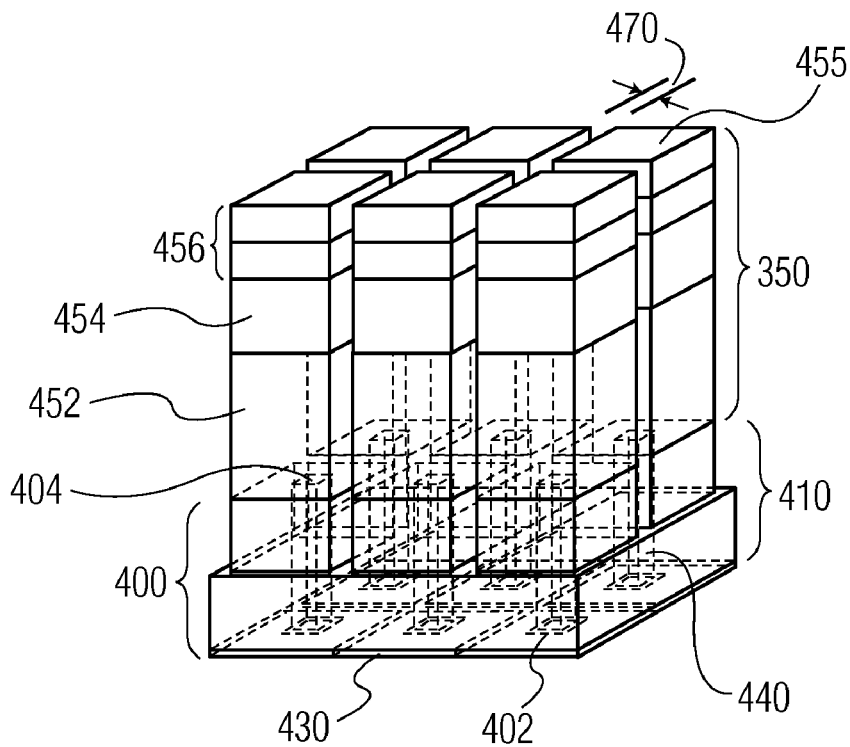
FIG. 4 shows a stack of acoustic elements coupled to an electrical component following a dicing of the stack in accordance with the present system.

The stack may be provided with a two dimensional dicing grid pattern 360 to facilitate dicing of the acoustic stack utilizing a deposition process, a photolithographic process, and/or other processes of the like. As shown in FIG. 4, the stack 350 may be cut, (e.g., see cut 470), for example with a dicing saw (e.g., diamond particle saw), to separate the stack 350 into individual acoustic elements 455. It should be readily appreciated that the acoustic elements 455 may be of any type and configuration including a configuration that facilitates 3-dimensional (3-D) imaging such as may be utilized for a 3-D ultrasonic imaging application and/or matrix transducer configuration.

The difficulty of electrically coupling an ASIC 400 to the acoustic elements 455 is typically compounded by a required dicing tolerance as discussed above. The cuts 470 separating the individual acoustic elements 455 have to be deep enough to separate the stack 350 into the individual acoustic elements 455. There are several components that make the requirements for a larger dicing depth tolerance. For example, there are variations in the thickness of the stack 350. Typically the stack is a laminate of three or more materials, namely a de-matching layer 452 (e.g., tungsten carbide), a piezoelectric crystal layer 454 which is the transponder, and one or more matching layers 456 (e.g., graphite). The three laminating materials, for example, each with different physical properties, may result in acoustic stacks that are not perfectly flat.

In addition, making so many cuts (e.g., thousands) results in saw blade wear of the dicing saw. Accordingly, even for a given depth cut, the last cuts are of a shallower depth than the initial cuts due to the blade wear. To compensate for this variation in the cut depth, the cut depth is typically selected to account for the shallower, later cuts. Further, a structure that consists of many parts previously joined (e.g., laminated) together in several separate processes has a problem of accumulating tolerances. For example, a tolerance in a thickness of the layers plus a tolerance in a flatness of the layers plus a tolerance in a bond thickness, etc., may result in a large accumulated variation from one portion of the structure to another portion of the structure. This potentially large variation must also be accommodated by introducing a correspondingly large tolerance in the cut depth.

All the component tolerances listed above typically adds up to a need for a relatively large (e.g., 70-100 um) gap between the stack 350 and the ASIC 400. This requirement for a large gap in prior systems translated to a corresponding large bump height. However, in accordance with the present system, the stack 350 is electrically coupled to the ASIC 400 utilizing electrically conductive through ASIC vias 440. Accordingly, the stack 350 is positioned on a bottom portion 404 next to a substrate layer 410 of the ASIC 400 away from a top portion 402 of the ASIC 400 where an active portion 430 and I/O of the ASIC 400 resides. Since the substrate 410 is not an active portion of the ASIC 400, the stack 350 may be diced with little concern for potential damage to the ASIC 400 while still accounting for dicing tolerances by dicing through the stack 350 and through a portion of the substrate 410. For example, for an ASIC substrate layer in the range of 50 um to 400 um thick, dicing cuts 470 may readily pass through a portion of the substrate without impacting either of a structural or electrical integrity of the ASIC as shown in FIG. 4.

Dicing of a portion of the substrate has an added benefit in that haze artifacts produced by coupling of acoustic energy into the ASIC may be reduced by the decoupling (separation) of portions of the substrate 410. Additionally, since the acoustic elements 455 are positioned farther from the active portion 430, the likelihood of coupling of acoustic energy into the ASIC 400 is further reduced.

Figure 5:
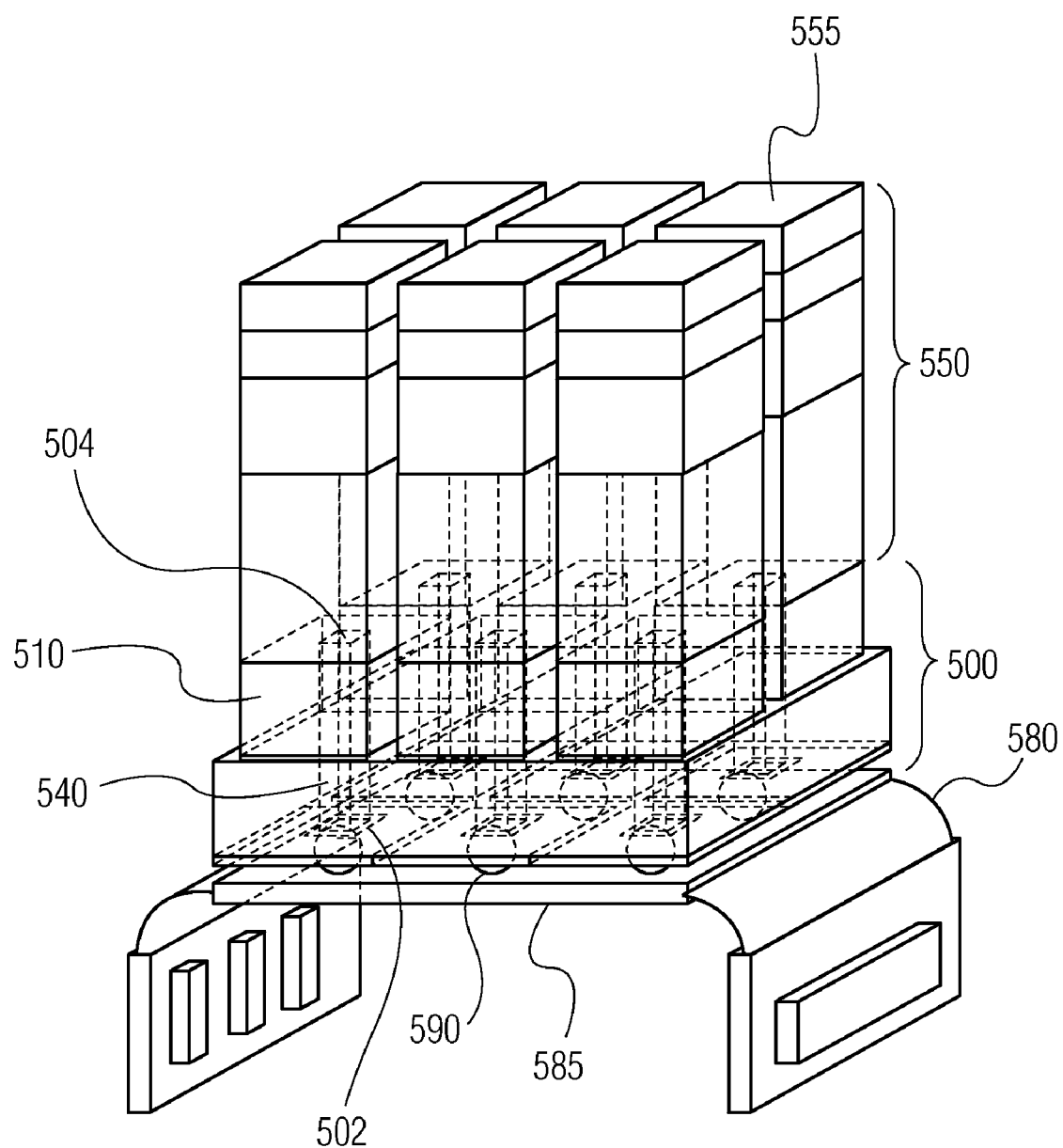
FIG. 5 shows details of an interconnection system in accordance with an embodiment of the present system.

In accordance with the present system, since the acoustic elements are positioned on a bottom portion of the ASIC away from the I/O of the ASIC, more flexibility is provided for electrically coupling to other I/O, such as sensor I/O of the ASIC. FIG. 5 shows details of an interconnection system in accordance with an embodiment of the present system. The system includes an electrical component, such as an ASIC 500 having acoustic elements 555 of a stack 550 electrically coupled to a back side 504 of the ASIC 500 leaving a top portion 502 available for a wide selection of electrical coupling options. The ASIC 500 includes a substrate 510 and a via 540. The flexible interconnect available in accordance with the present system is a vast improvement over prior systems since the ASIC 500 may be attached to an interconnect substrate such as a flex circuit 580, PCB 585, etc. directly without a need for wire bond traces, anisotropic conductive films, etc. This provides an ability for improved electrical performance by enabling putting more complex interconnections and circuitry (bypass caps, etc.) in closer proximity to the ASIC. Utilizing the present system, more complex interconnecting devices may be placed in close proximity to the ASIC than possible with the relatively simple flex circuits that prior systems are constrained to use. The ability of placing an interconnection directly adjacent to the I/O of the ASIC also helps simplify the interconnection process by eliminating a need for wire bonds, ACF, etc. to the top surface of the ASIC that are required to accommodate the typical proximity of the acoustic elements to the ASIC I/O in prior systems. Finally, the interconnect approach in accordance with the present system may potentially eliminate a need for interposers for microbeamformed arrays that require tiling of more than two rows of ASICs since the system I/O of the present system does not have to wrap around top edges of the ASIC to avoid acoustic elements.

In the illustrative embodiment shown, a rigid-flex interconnection 580 is provided. The interconnection 580 illustratively shown in FIG. 5 is coupled to the ASIC 500 utilizing contact balls 590 as is known in the art. Further, the interconnection 580 may be flip-chip mounted to the ASIC 500.

Advantageously, the interconnection system in accordance with the present system provides one or more of improved thermal performance, improved acoustic performance, process simplification, interconnect improvement and interconnect simplification.

Of course, it is to be appreciated that any one of the above embodiments or processes may be combined with one or with one or more other embodiments or processes to provide even further improvements in accordance with the present system.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof (e.g., ASIC, acoustic elements, etc.), it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise; and h) no specific sequence of acts or steps is intended to be required unless specifically indicated.

What is claimed is:

1. An acoustic assembly comprising:
   an integrated circuit package comprising a two dimensional pattern of electrically conductive vias configured to pass from an active portion of the integrated circuit package through a bottom portion of the integrated circuit package, wherein the bottom portion is a bottom side of a semiconductor substrate of the integrated circuit package; and
   an acoustic stack positioned on the bottom side of the substrate and electrically coupled to the electrically conductive vias, wherein the vias are arranged to electrically couple the active portion of the integrated circuit package to a two dimensional array of elements of the acoustic stack; and wherein the acoustic stack is diced into the two dimensional array of elements by dicing cuts extending in two directions through the acoustic stack.

2. The acoustic assembly of claim 1, wherein the acoustic stack is coupled to the via by an inverted flip-chip interconnection.

3. The acoustic assembly of claim 1, wherein the acoustic stack is coupled to the via by a conductive adhesive.

4. The acoustic assembly of claim 1, comprising an interconnection device positioned on a top side of the integrated circuit package in proximity to the active portion and electrically coupled to system input/output (I/O) connections of the integrated circuit package.

5. The acoustic assembly of claim 4, wherein the interconnection device is coupled to the system I/O connections by a flip-chip interconnection.

6. The acoustic assembly of claim 4, wherein the interconnection device is a flex circuit including a printed circuit board (PCB).

7. The acoustic assembly of claim 1, wherein the integrated circuit package is a microbeamformer ASIC.

8. A method of forming the acoustic assembly of claim 1, the method comprising the acts of:

providing an integrated circuit package;

forming a two dimensional pattern of electrically conductive vias in the integrated circuit package passing from an active portion of the integrated circuit package through to a bottom portion of the integrated circuit package, wherein the bottom portion is a bottom side of a semiconductor substrate of the integrated circuit package;

positioning an acoustic stack on the bottom side of the substrate;

coupling electrically the acoustic stack to the active portion of the integrated circuit package through the vias; and dicing the stack into a two dimensional array of transducer elements with dicing cuts extending in two directions through the stack and into the substrate.

9. The method of claim 8, wherein coupling comprises the act of performing an inverted flip-chip coupling process.

10. The method of claim 8, comprising the acts of:

etching a top side of the integrated circuit package in proximity to the active portion exposing a system input/output (I/O) connection; and depositing a bond pad electrically coupled to the system I/O connection.

11. The method of claim 10, comprising the acts of:

positioning an interconnection device on the top side; and coupling electrically the interconnection device to the system I/O connections.

12. The method of claim 11, wherein the act of coupling electrically the interconnection device to the system I/O connections comprises the act of performing a flip-chip coupling process.

13. The method of claim 11, wherein the interconnection device is a flex circuit including a printed circuit board (PCB).

14. The method of claim 13, wherein the integrated circuit package is a microbeamformer ASIC.

* * * * *